US012799581B2

(12) United States Patent
Chandramouli et al.

(10) Patent No.: US 12,799,581 B2
(45) Date of Patent: Nov. 17, 2026

(54) METHOD FOR PREPARATION OF POROUS HARD-CARBON NANOSTRUCTURES AND APPLICATIONS THEREOF

(71) Applicant: Indian Institute of Technology Bombay, Mumbai (IN)

(72) Inventors: Subramaniam Chandramouli, Mumbai (IN); Ananya Sah, Mumbai (IN); Vishwanath S. Kalyani, Mumbai (IN)

(73) Assignee: Indian Institute of Technology Bombay, Mumbai (IN)

( * ) Notice: Subject to any disclaimer, the term of this patent is extended or adjusted under 35 U.S.C. 154(b) by 92 days.

(21) Appl. No.: 18/718,040

(22) PCT Filed: Dec. 7, 2022

(86) PCT No.: PCT/IN2022/051059
§ 371 (c)(1),
(2) Date: Jun. 9, 2024

(87) PCT Pub. No.: WO2023/105537
PCT Pub. Date: Jun. 15, 2023

(65) Prior Publication Data

US 2025/0066904 A1 Feb. 27, 2025

(30) Foreign Application Priority Data

Dec. 8, 2021 (IN) ............................ 202121057013

(51) Int. Cl.
*C23C 16/01* (2006.01)
*C01B 32/05* (2017.01)
(Continued)

(52) U.S. Cl.
CPC .............. *C23C 16/01* (2013.01); *C01B 32/05* (2017.08); *C23C 16/0209* (2013.01);
(Continued)

(58) Field of Classification Search
None
See application file for complete search history.

(56) References Cited

U.S. PATENT DOCUMENTS

2009/0258782 A1* 10/2009 Gogotsi .................. A61P 31/12 502/402

OTHER PUBLICATIONS

Moronshing et al. (Year: 2020).*
Maity et al. (Year: 2017).*
Moronshing et al. supporting data (Year: 2020).*

* cited by examiner

*Primary Examiner* — Roberts P Culbert
(74) *Attorney, Agent, or Firm* — The Dobrusin Law Firm, P.C.

(57) ABSTRACT

The present invention provides a method for preparation of porous hard-carbon nanostructures and applications thereof. Particularly, the present invention provides a the method for preparation of porous nano-carbon florets (NCF) comprising chemical vapour deposition of a carbon source on a silica-based template followed by removal of silica via alkali-mediated etching and spray coating of NCF over desired substrates. The resulting nano-carbon florets (NCF) finds application in light-heat conversion such as use of NCF in solar-thermal conversion for generating temperature in dry state as well as for evaporating water; use of NCF in solar-thermal conversion for bacteriocidal disinfection of water. The NCF of the present invention may also be utilized for heavy metal scavenging and wastewater remediation.

9 Claims, 8 Drawing Sheets

(51) Int. Cl.
*C23C 16/02* (2006.01)
*C23C 16/26* (2006.01)
*B82Y 30/00* (2011.01)

(52) U.S. Cl.
CPC ............... *C23C 16/26* (2013.01); *B82Y 30/00* (2013.01); *C01P 2006/12* (2013.01)

METHOD FOR PREPARATION OF POROUS HARD-CARBON NANOSTRUCTURES AND APPLICATIONS THEREOF

FIELD OF THE INVENTION

The present invention relates to a method for preparation of porous hard-carbon nanostructures and applications thereof. Particularly, the present invention relates to the method for preparation of porous nano-carbon florets (NCF) comprising chemical vapour deposition of a carbon source on a silica-based template followed by removal of silica via alkali-mediated etching and spray coating of NCF over desired substrates. The resulting nano-carbon florets (NCF) finds application in light-heat conversion such as use of NCF in solar-thermal conversion for generating temperature in dry state as well as for evaporating water; use of NCF in solar-thermal conversion for bacteriocidal disinfection of water. The NCF of the present invention may also be utilized for heavy metal scavenging and wastewater remediation.

BACKGROUND OF THE INVENTION

Carbon forms an important element that is equally abundant in both natural and artificial systems. The various allotropic forms of carbon include diamond, graphite, amorphous carbon, Buckminster fullerene, carbon nanohorns, carbon nano-onions, nanodiamonds, single and multiwalled carbon nanotubes and graphene. While the first three belong to bulk materials, the latter seven are classified under the category of nano-structured carbon materials. Irrespective of this classification, all these allotropes can be universally referred to as soft-carbons due to their propensity to convert to the thermodynamically stable graphitic form when subjected to mechanical, thermal or electrical stress. Such graphitization is universally observed, though at varied kinetics and is enthalpically driven. In contrast, the family of hard-carbons are non-graphitizable and thermally stable due to the large entropy-driven combination of short-range graphitic ordering and long-range domain disorder. Thus, hard-carbons occupy a unique domain with the persistence length in the c-direction being similar to few layer graphene, while the disorder mimics the amorphous carbon.

Owing to the well-established routes for preparation and chemical modifications of soft-carbons, their utility has extended over wide-ranging domains such as water purification, air purification, energy storage, energy conversion, gas separation and storage, wearable electronics, adsorbents, catalytic support, electrically and thermally conductive fillers. In comparison, hard-carbons are conventionally obtained through pyrolysis of biomass or thermosetting polymers and are predominantly utilized as anodes for metal ion storage in batteries. These non-graphitizable form offer expanded d-spacing (0.37-0.42 nm) and large pore volume (1.23 $cm^3/g$) facilitating ion intercalation. Their unique structure consisting of C—O—C linkages between the short-range domains induces curvature and disorder to prevent any possible graphitization. However, the porosity tuning of such hard-carbons, analogous to their soft-carbon counterparts, has never been realized thus far. Accordingly, any further applications and development of hard-carbons has been severely impeded due to the lack of rational design principles and synthetic strategies. Furthermore, structural engineering of hard-carbons to achieve mono-dispersity in material and properties has been a long-standing challenge in this domain.

Consequently, when compared to the fundamental insights and applications developed for soft-carbons, the corresponding numbers are significantly lower for the hard-carbon counterparts (FIG. 1). Such a wide disparity of research in hard-carbons is mainly due to the lack of appropriate synthetic methodologies. While there have been established methods for tuning the structure, properties, dimensions, surface chemistry, porosity and surface area of soft-carbons, such approaches for hard-carbons are non-existent. The most common routes adopted in literature including patent/patent applications have been summarized in the table below:—

TABLE 1

List of patent applications and preliminary details available on the synthesis of hard-carbons

| Patent Application no. | Title | Raw material | Process and/or steps involved | Application |
|---|---|---|---|---|
| EP3953300 A1 | Process for preparing and use of hard-carbon containing materials | Usage of one or more animal faeces-derived material including human-faeces | Charring at 150° C. to 700° C. and/or Pyrolysis 700° C. to 2500° C. | Electrode material in energy storage devices |
| CN1144 36237 A | Hard carbon material and preparation method and application thereof | Biomass derivative (starch, cellulose or saccharides) carbon or organic matter with high molecular weight (phenolic resin or PAN) | 1. Precursor pre-oxidation (200-400° C.; 1-4 h; 3° C./min) 2. grinding to powder, microwave treatment (in air; 2-60 min), 3. Calcination (1000-1500° C.; heat preservation time 1-4 h, 2-5° C./min) | Negative electrode material |

TABLE 1-continued

List of patent applications and preliminary details available on the synthesis of hard-carbons

| Patent Application no. | Title | Raw material | Process and/or steps involved | Application |
|---|---|---|---|---|
| CN113120877 A | Method for preparing hard carbon material through spark plasma flash firing and application | Sucrose, fructose, and resin. | 1. Heat treatment dehydration (air, 160° C.). 2. Pre-treatment in tubular furnace (400-600° C.; Ar; 3-7 h). 3. Discharge plasma sintering furnace (heating 900-1300° C.; 500° C./min, sintering 1-10 min; 20-50 MPa). | negative electrode material for sodium ion batteries |

Broadly, all these approaches, detailed in Table 1, consists of common steps such as:—

A. Direct carbonization and pyrolysis of biomass from different precursors, and/or B. Pyrolysis of organic thermosetting polymer, thermoplastic polymers or resins, followed by their activation.

Most of these approaches also include a final activation step, to generate hard-carbons. Thermal carbonization of such materials would result in chemical and structural non-uniformity of the final material. The main aspects of such hard-carbons are:—

1. All such reports yield hard-carbons in bulk form without any tunability in structure, properties, dimensions, surface chemistry, porosity and surface area.
2. The solitary application that has been described in all these inventions is for electrochemical energy storage.

Further, in spite of a variety of natural and artificial mesoporous templates available, the infiltration of the organic precursors and its subsequent carbonization has been a severe limitation for fabrication of mesoporous, activated-carbon like materials. The bottleneck in this approach is the poor and non-uniform infiltration of the organic precursors, since all approaches focus on using liquids/solutions/dispersion forms of the organic precursor.

Thus, the lack of proper synthetic approaches to produce porous hard-carbons has resulted in low specific surface area, lack of porosity, non-tunability of surface chemistry and therefore has severely limited their applications. Therefore, there is a constant demand for both newer materials and processes for production of nanostructured carbon materials for varied applications.

SUMMARY OF THE INVENTION

In one aspect, the present invention provides a method for the preparation of porous hard-carbon nanostructure comprising the step of:

a) synthesizing porous hard-carbon nanostructure via chemical vapour deposition of a carbon source on a silica-based template such as dendritic fibrous nanosilica (DFNS); and
b) removing silica through alkali-mediated etching thereby resulting in formation of porous hard-carbon nanostructure.

In another aspect, the present invention provides a method of heavy metal scavenging from a sample comprising passing the sample through a column containing the porous hard-carbon nanostructures as prepared by the afore-mentioned method followed by collection of the effluent.

In another aspect, the present invention provides a method of solar-thermal conversion using the porous hard-carbon nanostructures as prepared by the afore-mentioned method for evaporating water, bacteriocidal disinfection of water and generating temperature in dry state.

In yet another aspect, the present invention pertains to use of porous hard-carbon nanostructures as prepared by the afore-mentioned method as adsorbent for heavy-metal scavenging from water.

In yet another aspect, the present invention pertains to use of porous hard-carbon nanostructures as prepared by the afore-mentioned method for solar-thermal conversion for generating temperature in dry state and evaporating water.

In yet another aspect, the present invention pertains to use of porous hard-carbon nanostructures as prepared by the afore-mentioned method for solar-thermal conversion for bacteriocidal disinfection of water.

BRIEF DESCRIPTION OF THE DRAWINGS

The foregoing summary, as well as the following detailed description of the invention will be better understood when read in conjunction with the appended drawings. For the purpose of assisting in the explanation of the invention, they are shown in the drawings embodiments which are presently preferred and considered illustrative. It should be understood, however, that the invention is not limited to the precise arrangements and representation shown therein.

DETAILED DESCRIPTION OF THE INVENTION

Figure 1:
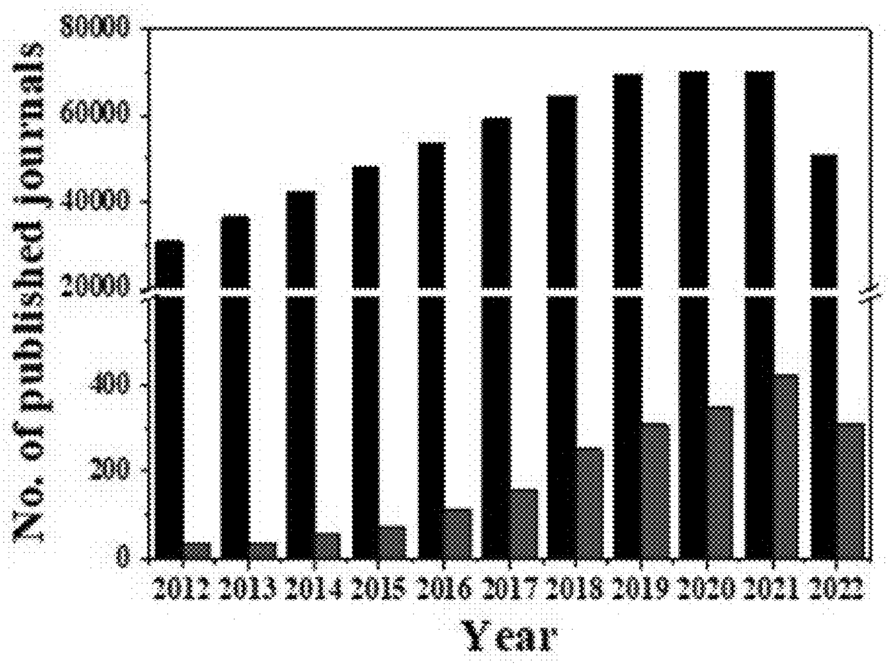
FIG. 1: Histogram of number of soft-carbon (black) vs hard-carbon (red) paper published in last 10 years as per ISI Web of Science.

For the purposes of the following detailed description, it is to be understood that the invention may assume various alternative variations and step sequences, except where expressly specified to the contrary. Moreover, other than in any operating examples, or where otherwise indicated, all numbers expressing, for example, quantities of ingredients used in the specification are to be understood as being modified in all instances by the term "about". It is noted that, unless otherwise stated, all percentages given in this specification and appended claims refer to percentages by weight of the total composition and the recitation of all numerical ranges by endpoints is meant to include the endpoints of the range, all numbers subsumed within the range and any range within the stated range.

Thus, before describing the present invention in detail, it is to be understood that this invention is not limited to particularly exemplified systems or process parameters that may of course, vary. It is also to be understood that the terminology used herein is for the purpose of describing particular embodiments of the invention only, and is not intended to limit the scope of the invention in any manner.

Unless otherwise defined, all technical and scientific terms used herein have the same meaning as commonly understood by one of ordinary skill in the art to which this invention pertains. In the case of conflict, the present document, including definitions will control.

It must be noted that, as used in this specification and the appended claims, the singular forms "a," "an" and "the" include plural referents unless the content clearly dictates otherwise. Thus, for example, reference to a "polymer" may include two or more such polymers.

The terms "preferred" and "preferably" refer to embodiments of the invention that may afford certain benefits, under certain circumstances. However, other embodiments may also be preferred, under the same or other circumstances.

Furthermore, the recitation of one or more preferred embodiments does not imply that other embodiments are not useful, and is not intended to exclude other embodiments from the scope of the invention.

As used herein, the terms "comprising" "including," "having," "containing," "involving," and the like are to be understood to be open-ended, i.e., to mean including but not limited to.

References herein to "one embodiment", "one aspect" or "one version" of the invention include one or more such embodiment, aspect or version, unless the context clearly dictates otherwise.

In one aspect, the present invention provides a method for the preparation of porous hard-carbon nanostructure comprising the step of:

a) synthesizing porous hard-carbon nanostructure via chemical vapour deposition of a carbon source on a silica-based template such as dendritic fibrous nanosilica (DFNS); and
b) removing silica through alkali-mediated etching thereby resulting in formation of porous hard-carbon nanostructure.

In an embodiment of the present invention, step (a) comprises:

a) keeping dendritic fibrous nanosilica (DFNS) in an alumina boat placed in the hottest zone of chemical vapour deposition (CVD) furnace and heated first to 120 °C in the furnace, under inert conditions to remove the adsorbed water for 15 minutes;
b) heating the dendritic fibrous nanosilica (DFNS) between 700 °C to 800 °C with 5 °C/min to 10 °C/min ramp rate in presence of helium atmosphere at a flow rate 700 SCCM; and
c) flowing a carbon source at 100 SCCM for 10 minutes as soon as the temperature reaches 740 °C followed by cooling the chemical vapour deposition (CVD) furnace till room temperature and collecting black powder of carbon coated silica nanospheres from the boat.

In an embodiment of the present invention, the carbon source in step (c) is selected from the group consisting of acetylene, methane, carbon dioxide, carbon monoxide, ethanol, isopropanol, butane and isobutene. The carbon source is introduced in gas-phase over the silica material under controlled conditions of temperature, pressure, flow-rate of gases to ensure uniform and three-dimensionally conformal deposition of carbon over the silica.

In an embodiment of the present invention, step (b) comprises:

a) dispersing carbon coated silica nanospheres obtained in step (c) of aforementioned process in an etching solution, keeping the same in a vacuum desiccator and evacuated to 10 torr for 10 minutes, taking it out followed by stirring for 4 to 8 hours to etch out silica to obtain porous hard-carbon nanostructure; and b) washing porous hard-carbon nanostructure with deionized water till the pH turned neutral followed by drying of hard-carbon nanostructure.

In an embodiment of the present invention, the etching solution is selected from the group consisting of 1 M sodium hydroxide (NaOH), 1 M potassium hydroxide (KOH), 1 M cesium hydroxide (CsOH), 2.5 M sodium hydroxide (NaOH), 2.5 M potassium hydroxide (KOH), 2.5 M cesium hydroxide (CsOH), buffered hydrogen fluoride (HF) and hydrogen fluoride (HF).

The time duration for the complete removal of silica is given in the following table 2:

| Chemical | Concentration | Temperature | Time |
|---|---|---|---|
| NaOH/KOH/CsOH | 1M | 25 deg C. | 8 h |
| NaOH/KOH/CsOH | 2.5M | 25 deg C. | 6 h |
| NaOH/KOH/CsOH | 1M | 60 deg C. | 6 h |
| NaOH/KOH/CsOH | 2.5M | 60 deg C. | 4 h |
| Buffered HF | 6:1 volume ratio of 40% NH4F in water to 49% HF in water | 25 deg C. | 4 h |
| HF | 48-52% in water | 25 deg C. | 4 h |

In an embodiment of the present invention, the hard-carbon nanostructure are dried at 80 °C in an oven for 2 hours or in supercritical $CO_2$ for 5 hours or in a lyophilizer for 5 hours.

In a preferred embodiment of the present invention, dendritic fibrous nanosilica (DFNS) or nanofibrous silica spheres (NSS) is prepared as per Example 1. The prepared DFNS is kept in alumina boat which is further placed in the hottest zone of CVD furnace and heated at 740 °C in presence of helium atmosphere such as helium stream (flow rate 700 SCCM). Acetylene is flowed through as a carbon source at 100 SCCM for 10 minutes as soon as the temperature reaches 740 °C Later, acetylene stream was stopped after 10 minute time and Helium gas was continuously purged. CVD furnace is allowed to cool down till room temperature and the carbon coated silica nano-spheres obtained is further dispersed in 1M NaOH solution at 800 rpm and is stirred for 5 hours to etch out the silica. It is centrifuged and washed with deionised (DI) water till the pH turned neutral. Finally, it is dried at 80 °C to collect the NCF for further characterization. The NCF may be further purified though a $CO_2$ critical point dryer for 40 min (80 °C, 14 MPa).

In an embodiment of the present invention, the afore-mentioned process further comprises preparing porous hard-carbon nanostructure dispersion for spray coating of hard-carbon nanostructure over a substrate. The porous hard-carbon nanostructure is dispersed in isopropanol via bath sonication for 2-10 minutes followed by spray coating of porous hard-carbon nanostructure using a spray coater over a substrate.

In an embodiment of the present invention, the substrate is selected from the group consisting of filter paper, terracotta, tapered Copper (Cu) helical coil and tapered Aluminum (Al) coil depending on the required application.

In an embodiment of the present invention, the dendritic fibrous nanosilica template of step (a) is prepared hydrolysis of at least one silica source in the presence of at least one surfactant. The silica source is tetraethyl orthosilicate or other silicate precursors. The surfactant is selected from the group consisting of cetyl trimethyl ammonium bromide, 1-pentanol, hexanol, sodium dodecyl sulphate, sodium deoxycholate and derivatives thereof.

In an embodiment of the present invention, the porous hard-carbon nanostructures are nanocarbon florets (NCF) having a surface area in the range of 850 $m^2/g$ to 1200 $m^2/g$. The florets are formed of lamellar, feather-like graphitic sheets that converge at the centre and are held in place through a solid, connected core, much like a marigold flower. These florets offer a large accessible area for adsorption, are hydrophilic and chemically stable in highly acidic or alkaline water.

Such a method of preparation of NCF have distinct advantages such as (a) use of gas-phase deposition of carbon through chemical vapor deposition ensures complete infiltration of carbon over the micro-pores and meso-pores of silica template, (b) single step of infiltration of the carbon into the silica template without requiring additional carbonization or pyrolysis step, (c) conformal and uniform coating of carbon over the silica template, resulting in mono-disperse NCF structures with well-defined dimensions and morphology. Further the surface properties of NCF can be tuned from super hydrophobic (with HF or buffered HF) to hydrophilic (with NaOH/KOH/CsOH) by using suitable etching chemical. Thus NCF is only material that combines micro- and meso-porosity with the hard-carbon structure and unique open-ended morphology.

In another aspect, the present invention provides a method of heavy metal scavenging from a sample comprising passing the sample through a column containing the porous hard-carbon nanostructures as prepared by the afore-mentioned method followed by collection of the effluent. The heavy metals are selected from the group consisting of $Hg^{2+}$, $Cd^{2+}$, $As^{3+}$, $Cr^{6+}$ and $Cr^{3+}$ and the sample is water or wastewater or industrial water.

The nanocarbon florets of the present invention can remove up to 90% of pollutants containing arsenic, chromium, cadmium and mercury. These florets also work in contaminated water with a wide range of acidity or alkalinity. They remove impurities by adsorption-impurities stick to the surface of the florets as the water passes over it. The florets may be washed with a mild acid for the subsequent use. The nanocarbon florets of the present invention are chemically and mechanically robust and stay stable over a wide temperature range. Hence, they are a convenient and sustainable solution to decontaminate water.

In another aspect, the present invention provides a method of solar-thermal conversion using the porous hard-carbon nanostructures as prepared by the afore-mentioned method for evaporating water, bacteriocidal disinfection of water and generating temperature in dry state.

The three-dimensional dendritic structure of NCF integrates (a) open-ended framework for large interfacial area (936 m2 $g^{-1}$, pore volume 1.23 cm3 $g^{-1}$) with (b) strong intrinsic n-band optical transitions associated with non-graphitizable sp2 C═C framework and (c) unique continuously graded conical structures mimicking optical micro-cavities that funnel the incident photons for multiple reflections for near-perfect absorbance (>0.95) over the entire solar spectrum (250-2500 nm). Importantly, spray-painted NCF coatings on arbitrary substrates (cellulose, porous terracotta, Cu, PDMS) thermalize the photons at remarkably high ηSTC of 87%. This results in output temperatures of 400±2 K, 323±3 K and 396±3 K under average 2 sun irradiance in dry-state, during water evaporation and space-heating, respectively. Thus NCF achieves both high rate of water evaporation (Rw=5.4 kg $m^{-2}$ $h^{-1}$, FIG. 9) and the exceptional efficiency towards solar-thermal conversion (ηSTC=87%); highest among known materials. The high ηSTC and ηSVC (186%) are uniformly high over a range of solar conditions (1-5 sun equivalent of 1000 $Wm^{-2}$ to 5000 $Wm^{-2}$). Combining all these enables demonstration of scalable processability and long-term operational stability (30 days) with 50 L batches for solar-driven water evaporation with NCF-coated porous terracotta (NCF-TC) as interfacial heaters. Extending the concept, air flown through NCF-coated hollow Cu tubes gets heated to 396±3 K providing an innovative green route for practical space-heating. In a first-of-its-kind demonstration, bacteria contaminated water ($10^4$ CFU $ml^{-1}$) flowing through NCF coated hollow Al tubes is heated beyond 80 °C, leading to thermally induced destruction of the bacteria. Furthermore, we demonstrate macroscale light-driven mechanical rotation through thermal transpiration with asymmetrically coated NCF blades, illustrating the versatility of both the material and its processability. Thus, NCF coatings transform any dormant surface into a functional one for green-heat generation and utilization.

In yet another aspect, the present invention pertains to use of porous hard-carbon nanostructures as prepared by the afore-mentioned method as adsorbent for heavy-metal scavenging from water.

In yet another aspect, the present invention pertains to use of porous hard-carbon nanostructures as prepared by the afore-mentioned method for solar-thermal conversion for generating temperature in dry state and evaporating water.

In yet another aspect, the present invention pertains to use of porous hard-carbon nanostructures as prepared by the afore-mentioned method for solar-thermal conversion for bacteriocidal disinfection of water.

The following examples are provided to better illustrate the claimed invention and are not to be interpreted in any way as limiting the scope of the invention. All specific materials, and methods described below, fall within the scope of the invention. These specific compositions, materials, and methods are not intended to limit the invention, but merely to illustrate specific embodiments falling within the scope of the invention. One skilled in the art may develop equivalent compositions, materials, and methods without the exercise of inventive capacity and without departing from the scope of the invention. It will be understood that many variations can be made in the procedures herein described while still remaining within the bounds of the invention. It is the intention of the inventors that such variations are included within the scope of the invention.

The present invention will now be more particularly described with reference to the following examples. It is to be understood that these are intended to illustrate the invention and in no manner to limit its scope.

EXAMPLES

1) Synthesis of nanofibrous silica spheres (NSS): Cetyl trimethyl ammonium bromide (CTAB, $C_{19}H_{42}BrN$, 2 g, 0.005 mol) and urea ($CH_4N_2O$, 2.4 g, 0.04 mol) were dissolved in deionised water (100 mL) at room temperature and stirred in a round-bottom flask for 30 minutes. On the other hand, tetra ethyl orthosilicate (TEOS, $SiC_8H_{20}O_4$, 4.7 g, 0.023 mol) was taken in 100 mL of cyclohexane was then added drop wise in the above solution and stirred for 1 hour at room temperature. The co-surfactant 1-pentanol ($C_5H_{12}O$, 3.10 mL, 0.055 mol) was then added drop wise in above mixture and further stirred for 30 min at room temperature. Finally, the reaction mixture was then refluxed at 82 °C using an oil bath for 12 h under continuous stirring. After cooling the reaction mixture, the white suspension was centrifuged and solid was collected and washed multiple times with deionised water and ethanol. The obtained white powder was dried at 80 °C for 12 h and subsequently calcined at 550 °C for 6 h to remove the surfactants and co-surfactants and yield pure NSS.

2) Synthesis of nanostructured carbon florets (NCF): Dendritic Fibrous Nanosilica (DFNS) or nanofibrous silica spheres (NSS) is prepared as mentioned in Example 1. The prepared DFNS was kept in alumina boat which was further placed in the hottest zone of CVD furnace and heated at 740 °C in presence of Helium atmosphere (flow rate 700 SCCM). Acetylene was flowed through as a carbon source at 100 SCCM for 10 minutes as soon as the temperature reaches 740 °C CVD furnace was allowed to cool down till room temperature and the carbon coated silica nano-spheres obtained was further dispersed in 1M NaOH solution and was stirred for 5 h to etch out the silica. It was washed with DI water till the pH turned neutral. Finally, it was dried at 80 °C to collect the NCF for further characterization.

3) Preparation of nanostructured carbon florets (NCF) dispersion for spray coating: 20 mg of NCF was dispersed in 5 ml of isopropanol via bath sonication for 2 minutes and was spray coated using spray coater over desired substrate such as filter paper, terracotta, tapered Cu helical coil, tapered Al coil depending on the required application studied.

4) Characterization of NCF to Establish Hard-Carbon Structure

Figure 2:
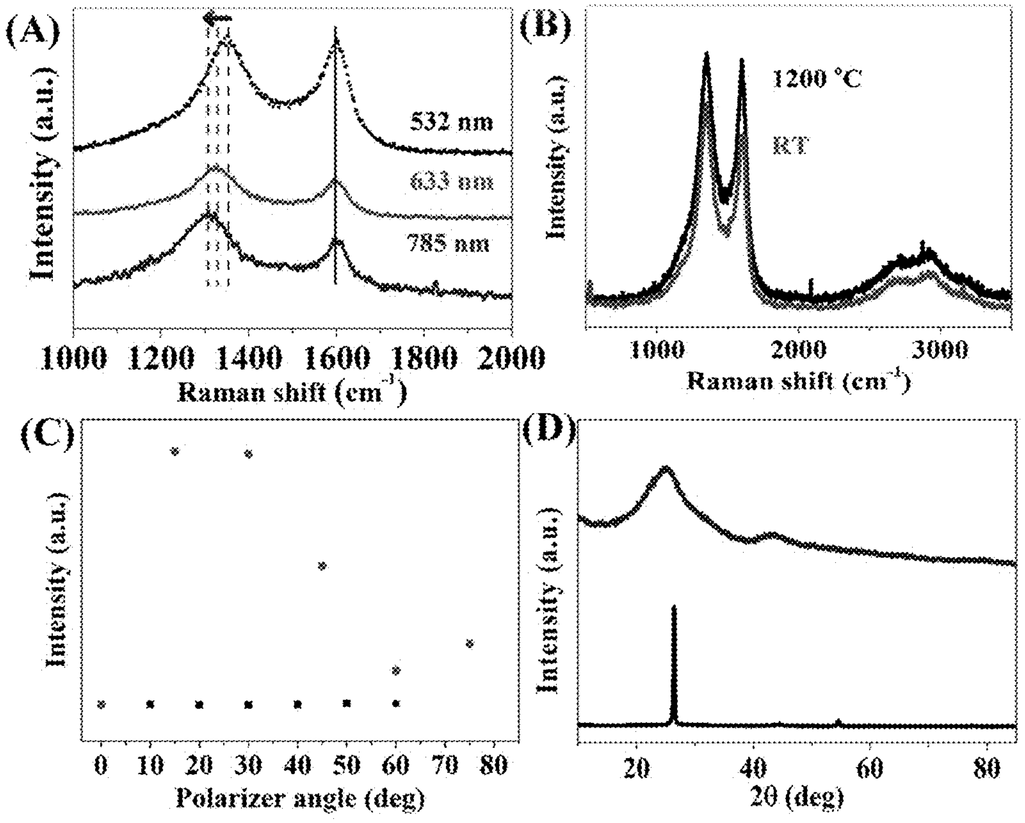
FIG. 2: A) Raman spectra of pristine NCF at 532 nm, 632.8 nm and 785 nm. B) Raman spectra of pristine NCF (532 nm) at room temperature (red) and heated at 1200 °C (black). C) Change in ID (NCF black) and (CNT red) with polarizer angle. D) p-XRD OF NCF (blue) and graphite (black).

Raman spectrum of the NCF shows a prominent in-plane tangential vibrational mode of G-band (1600 $cm^{-1}$), $sp^2$ C═C framework, and D-band (1350 $cm^{-1}$) (black trace, FIG. 2*a*). Interestingly, the D-band exhibits a sequential bathochromic shift in spectral position upon changing the excitation wavelength from 532 nm to 632.8 nm and subsequently to 785 nm (black, red and blue traces of FIG. 2*a*, respectively). In contrast, no such shift is observed in G-band (FIG. 2*a*). This behavior is characteristic of intrinsically disordered hard-carbon structures due to the combination of electron-phonon scattering and disorder-induced scattering. The D-band originating from double-resonance Raman scattering involves a K-K' momentum shift in such cases and is therefore not observed with other soft nanocarbons such as carbon nanotubes. Consequently, the conclusive proof of the non-graphitizable hard-carbon structure of NCF is obtained from the Raman spectrum after heating of NCF to 1200 °C for over 2 hours. The Raman spectrum shows that the position of D-band and G-band do not change with heating, indicating no graphitization has happened during the heating (FIG. 2*b*). The long-range disorder in NCF is further confirmed from its polarized Raman spectra that shows uniform intensities of D and G band originating from randomly oriented graphitic domains, unlike structurally oriented and aligned nanocarbons (FIG. 2*c*). Additionally, the D-band intensities are enhanced in spectra collected with 632.8 nm and 785 nm excitations due to prominent resonance effects, reconfirming the long-range disorder. Powder XRD also provides further confirmation with a broad peak at 2θ of 25°, corresponding to (002) reflection and expanded d-spacing (0.36 nm). The downshifted peak position (25°) and larger full width half maximum of this reflection (9°) in comparison to graphitic carbons (3°), establishes the expanded interlayer spacing and large pore volume of NCF (FIG. 2*d*).

Figure 3:
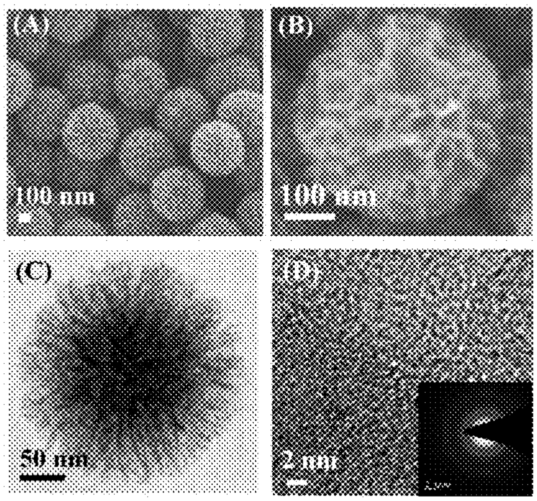
FIG. 3: Characterisation of NCF. A and B) SEM images C) TEM images of NCF D) HRTEM of NCF [inset: SAED pattern of NCF].
Figure 4:
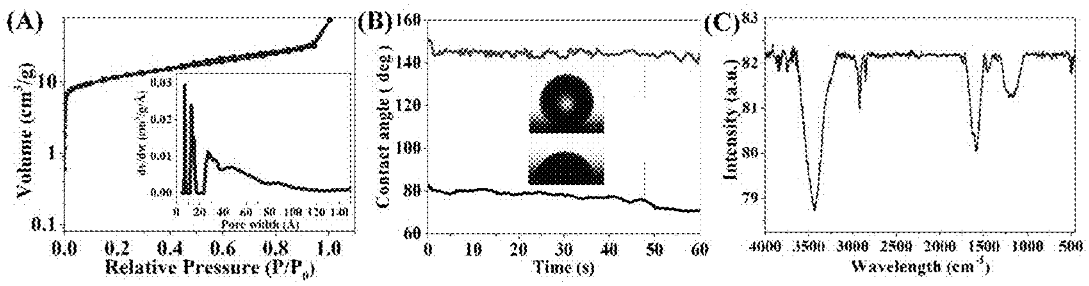
FIG. 4: Characterisation of NCF. A) $N_2$ adsorption isotherm [inset: pore diameter distribution]B) Contact angle of alkali-etched NCF (black) and HF etched NCF (red) (inset photo) C) FTIR spectra of pristine NCF.

The NCF presents an open-framework morphology (FIG. 3*a,b*) with larger accessible surface area (936 m2 $g^{-1}$, FIG. 4*a*) and pore volume (1.23 cm3 $g^{-1}$, inset FIG. 4*a*). Each NCF (mean diameter: 465±20 nm, mono-dispersity index of 0.9, FIG. 3*a*-*d*) resembles a marigold with several intricately folded, dendritic lamellae (florets) exhibiting graded conical channel originating from its center and emerging at the surface (FIG. 3). Such florets are interlocked into a close-packed spherically symmetric geometry. The TEM and HR-TEM images (FIG. 3*c,d*) provide direct visual proof of the short-range graphitic ordering and the long-range disorder, establishing the hard-carbon structure of NCF.

5) Surface Functionalizations

The alkali-etching step to make NCF introduces hydroxy-functionalities to NCF, as confirmed from the 3433 $cm^{-1}$ νOH absorption in the infrared spectrum (FIG. 4*c*) and an initial water contact angle of 80° that decreases to 70° within 60 s of contact (black trace, FIG. 4*b*). In contrast, removal of DFNS using HF yields F-terminated hydrophobic NCF (red trace, FIG. 4*b*). Thus, the surface chemistry of NCF can be tuned over a wide range of hydrophobic to hydrophilic. This aspect has not been established before with hard-carbons and opens up new directions for applications.

6) Optical Properties

Figure 5:
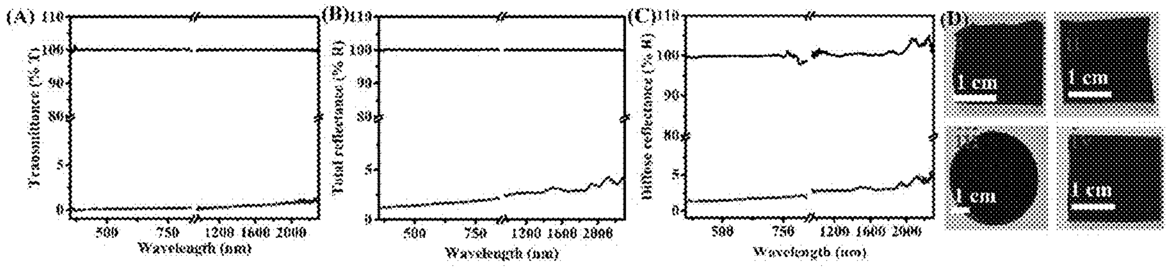
FIG. 5: Optical characterisation. A) Transmittance (blue) B) Total reflectance (blue) C) Diffuse reflectance (blue) of NCF against reference (black) D) Photographs of spray-painted NCF coatings on different substrates such as cellulose paper (i), poly-dimethylsiloxane, PDMS (ii), Terracotta clay (iii) and Cu sheet (iv).
Figure 6:
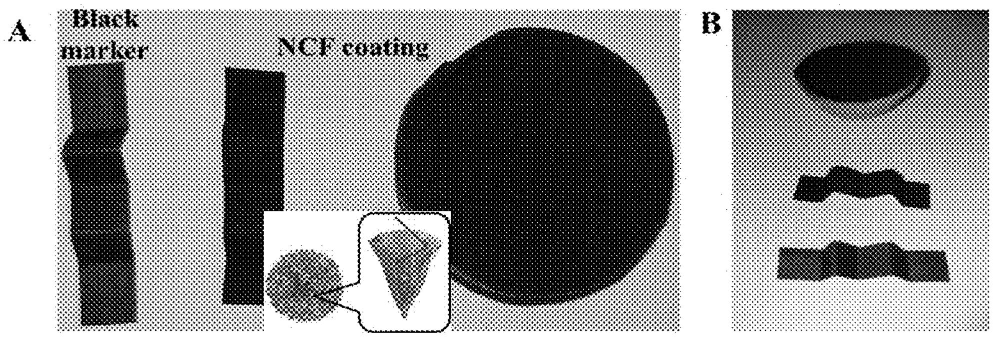
FIG. 6: Photographs A) Top view of NCF-TC, NCF-FP and paper coloured with black marker (Right to left) [Inset: Schematic of NCF lamellae showing multiple internal reflection]. B) Side view of same samples showing their three dimensionality.

The structural integrity of NCF is retained in spray-coated films on substrates with wide-ranging surface properties such as PDMS sheet (hydrophobic), Cu metal (hydrophilic), cellulose filter paper (organic, porous) and terracotta clay (inorganic, porous) (FIG. 5*d*). All such coating exhibits chemical and thermal stability along with good adhesion to the substrates (adhesion strength=5.25 MPa). The strong absorbance by such NCF-films is evidenced, in all such coatings, in both transmittance, total reflectance and diffuse reflectance geometries over the entire solar spectral range (250-2500 nm) (blue traces, FIG. 5*a,b,c*). The high absorbance and minimal light scattering by NCF results in three-dimensional coated surfaces visually appearing as flat, two-dimensional surfaces (inset, FIG. 6). Such near-perfect black-body broad-band absorbance is attributed to the synergy between (a) $sp^2$ C═C framework with metal-like carrier concentration ($1.71\times10^{19}$ $cm^{-3}$), and (b) three-dimensional optical micro-cavities with graded porosity of the NCF to internally funnel the incident photons, leading to enhanced absorbance (inset, FIG. 6*a*).

7) Solar to Thermal Conversion

Hard carbons represent an interesting combination of short-range ordered and long-range disordered systems that provides excellent thermal stability and electrical conductivity. In the context of solar-thermal conversion (STC), the short-range graphitic ordering is effective for activating phonons and producing heat, while the long-range disorder across such graphitic domains leads to localized phonons and thereby confines the heat generated. Finally, the NCF represents the first known porous hard-carbon material and would therefore provide transformative opportunities in solar-thermal conversion and its applications.

Figure 7:
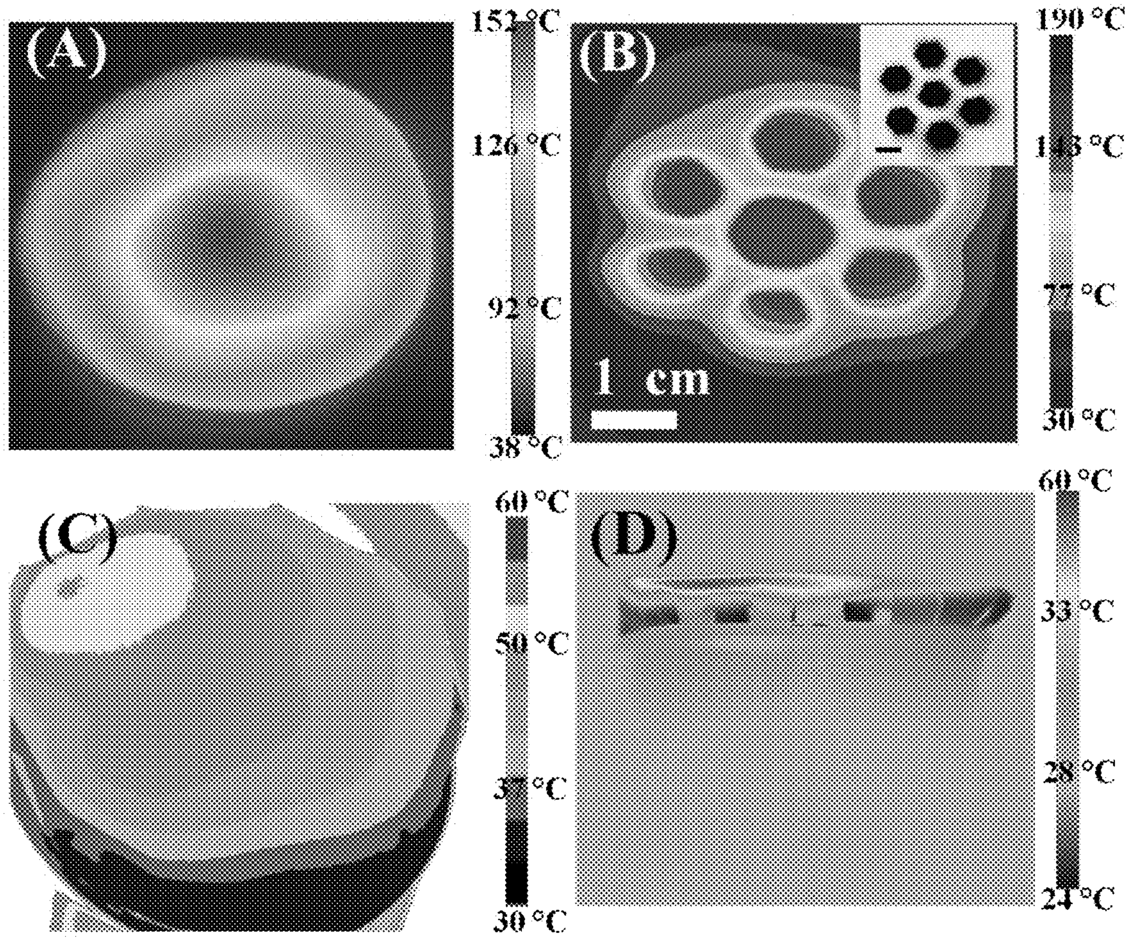
FIG. 7: A) Thermal images of NCF-FP under dry condition B) Thermal image of hexagonally patterned NCF-FP [inset: photograph]C) Thermal images of NCF-FP under wet condition D) Thermal image of beaker during interfacial water evaporation with NCF-FP.

The combination of porous hard-carbon structure and the conical cavitational assembly of NCF makes it an ideal solar-thermal convertor. Herein, pristine NCF coated on filter paper (NCF-FP) exhibits instantaneous thermalization under Xe lamp (2000 W $m^{-2}$, that closely mimics the solar spectrum) to yield high surface temperature of 152 °C, as measured by thermometric imaging (FIG. 7*a*). Control experiments under identical conditions produced negligible change in surface temperature (ΔT<20 °C) with pristine filter paper. Additionally, patterned NCF-FP substrates also exhibit instantaneous thermalization, with ΔT=135 °C within 120 s of illumination (FIG. 7*b*). Importantly, the temperature is confined within regions containing NCF-coating and the uncoated regions exhibiting negligible ΔT. Furthermore, the generated heat dissipates slowly across the uncoated filter paper due to the low in-plane thermal conductivity of NCF (1.5 W $m^{-1}$ $K^{-1}$) and the substrate (0.05 W $m^{-1}$ $K^{-1}$). In fact, the low in-plane thermal conductivity indicates that the solar-thermal heat generated on the surface of NCF is more likely to dissipate vertically than horizontally. These results unambiguously confirm the direct role of NCF in thermalizing the incident photons.

8) Solar-Thermal Interfacial Water Evaporation

Whatman No 41 filter paper was cut in a wheel shape having 16 fins (4 cm×0.5 cm) with inner circle diameter of 4 cm. One side was spray-coated with NCF and the fins were dipped in a 50 ml beaker containing water. As soon as a layer of water develops over the circular surface the entire setup is placed under Xe lamp (2 sun) for required time interval. The change in weight before and after the experiment was measured. A control experiment under dark environment was carried out using similar setup. For desalination experiment, water containing 500 ppm of NaCl was utilized. The experiments were repeated at different loading of NCF on filter paper (0-1.9 mg·$cm^{-2}$). The surface temperatures were monitored via thermal imaging using FUR thermal camera (A6703sc). NCF was coated over terracotta and experiment was carried out under real-time conditions for 30 days and volume of water was measured before and after the experiment.

NCF-FP is assembled into an interfacial geometry for solar-driven water evaporation with the vertical fins enabling water-transportation through capillary action and the horizontal surface providing the extensive tri-junction interface between water, NCF and energy-carrying photons. The uncoated bottom surface of the filter paper, facing the water reservoir acts as an effective thermal barrier and minimizes the radiative thermal loss, as observed from the near ambient temperature of the air trapped between the water and NCF-FP (FIG. 7*d*).

Surface temperature of NCF-FP was estimated to be 50±3 °C during the water evaporation experiments. This temperature is significantly lower than the surface temperature realized with bare NCF-FP since it represents the dynamic thermal equilibrium of the system in which the endothermic water evaporation from surface of NCF-FP balances the exothermic STC by NCF. Importantly, the capillarity and hydrophilicity of NCF-FP ensures that the water lost due to evaporation is instantaneously replenished from the reservoir.

Figure 8:
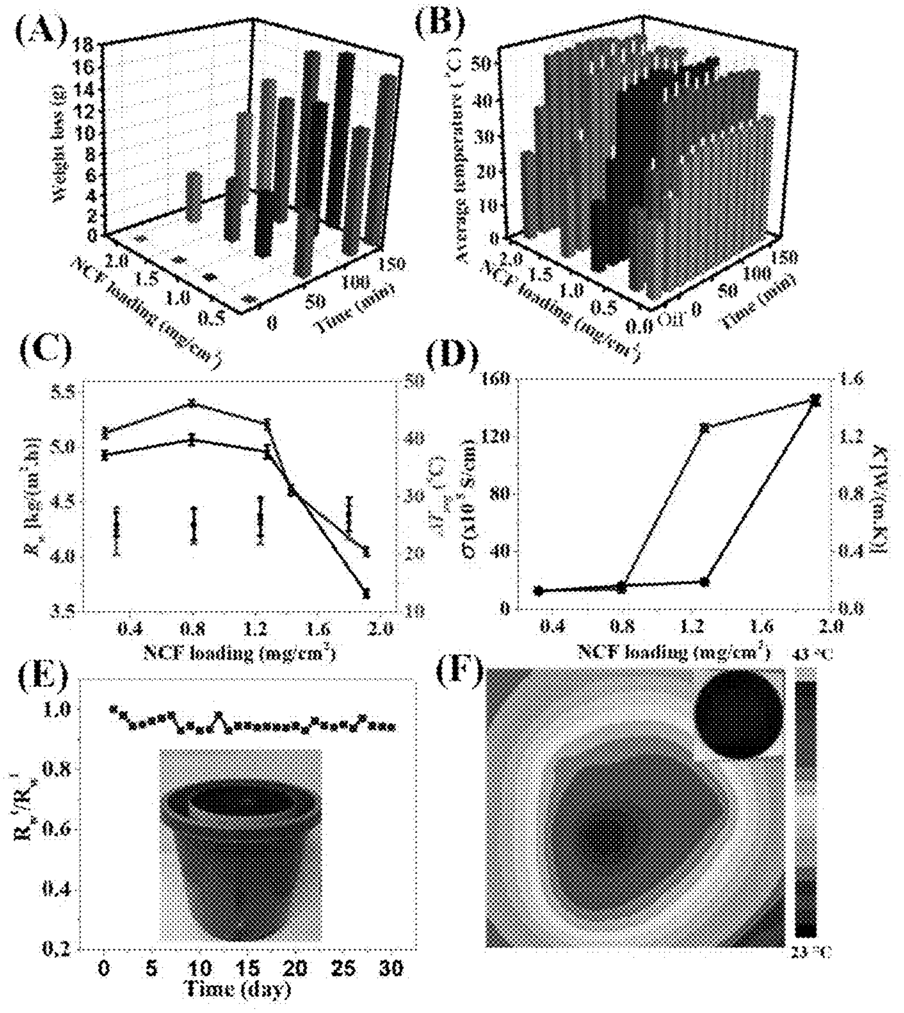
FIG. 8: Solar-steam generation with NCF. A and B) Temporal variations in water evaporated by NCF-FP and its surface temperatures at different loadings of NCF. C) Variation in steady-state $R_w$ and $\Delta T_{avg}$ for varying loadings of NCF. D) Variation in electrical ($\sigma$) and thermal ($\kappa$) conductivities of NCF-FP at varying loadings of NCF. E) Relative change of $R_w$ over 30 days with respect to $1^{st}$ day using NCF-TC as interfacial evaporator in 50 litre batches with the setup shown in inset. F) Thermometric image of NCF-TC during usage.

Accordingly, the weight of water evaporated from the reservoir monotonically increases with time without any saturation even beyond 150 min (FIG. 8*a,b*) before which the rate of water evaporation (Rw) reaches steady-state confirming instantaneous heat generation (FIG. 8*a,b*). Increase in loading of NCF (0.2-0.8 mg $cm^{-2}$) produces a monotonic increase in Rw (5.13-5.40 kg $m^{-2}$ $h^{-1}$), while any further increase in loading (0.8-1.9 mg $cm^{-2}$) causes sharp decrease in Rw (FIG. 8*c*). This counter-intuitive observation is corroborated by the large percolation-like increase in electrical and thermal conductivities (7.6- and 9-fold increase, respectively) of NCF-FP beyond the loading of 0.8 mg $cm^{-2}$ (FIG. 8*d*). Higher surface coverage results in formation of electrical and thermal conductive pathways across the NCF-FP. These produce parasitic thermal dissipative channels that effectively compete with the water evaporation thereby lowering the Rw. Thereby, an optimal surface coverage of 0.8 mg $cm^{-2}$ provides the highest water evaporation rate of 5.4 kg $m^{-2}$ $h^{-1}$. The maximum Rw observed during such experiment (5.4±0.03 kg m−2 h−1) is significantly higher than several other reports in the literature. We note that all the data and numbers reported are after correction with the evaporation under dark conditions (Rw=0.113 kg $m^{-2}$ $h^{-1}$).

Figure 10:
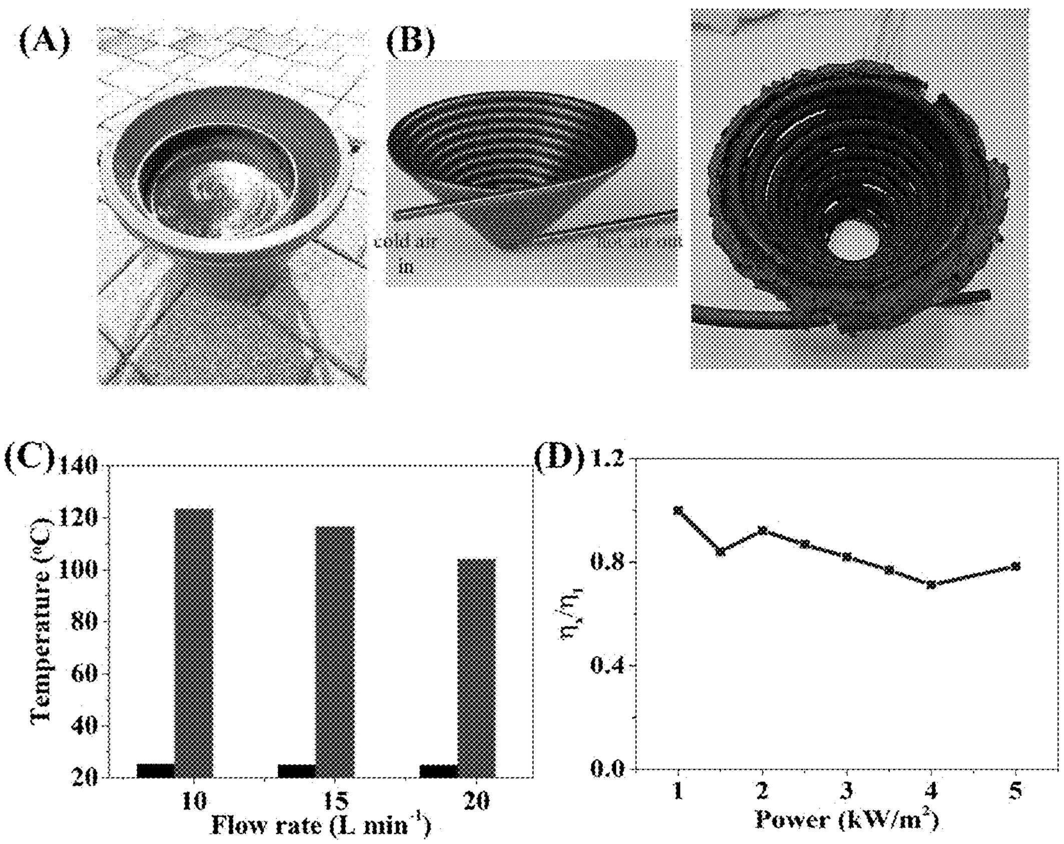
FIG. 10: Versatile demonstrations with NCF coated on A) Terracotta Petri dish for large scale steam generation, B) Hollow Cu tubes for space heating (C) Inlet (black) and outlet (red) air temperatures under different flow rates using the NCF-coated hollow Cu tubes shown in B). Solar-thermal conversion efficiency of NCF coating under varying solar irradiance (1 sun-5 sun) with respect to performance under 1 sun.

Although NCF-FP provided consistent performance as interfacial heater, its practical limitation arises due to degradation of the cellulose matrix. Therefore, it was replaced NCF coated on terracotta surface (NCF-TC) having similar porosity, enabling real-time measurements under natural sun-light (FIG. 8*e*). Such a versatility is brought about by the ease of processability of NCF and delivers an identical ΔTavg of 23 °C, consistent with NCF-FP (FIG. 8*f*). Furthermore, the minimal variation in Rw is noted for over 30 days of continuous usage. Importantly, such a setup processes 50 liters batches of water at zero-energy cost with potential scalability for practical applications (FIG. 8*e*, FIG. 8*f* and inset, FIG. 10*a*). The thermal and chemical stability of NCF under real time conditions is confirmed from its unchanged morphology and performance. These aspects make NCF ideal for deployment in economically deprived areas and thereby presents a new concept towards sustainable and scalable strategy for achieving water energy *nexus*.

9) Benchmarking the Performance

Evaluating the performance of solar-thermal conversion materials involve three orthogonal parameters, namely a. solar-thermal conversion efficiency (ηSTC)

b. solar-vapor conversion efficiency (ηSVC) and c. water evaporation rate (Rw), with an ideal material expected to exhibit high ηSTC, ηSVC and Rw. However, achieving this synergistic combination has been a significant challenge due to the mutually exclusive fundamental requirement of strong photon-induced phonon activation and low thermal conductivity. The ηSVC and ηSTC are given by, $$\eta_{SVC} = \frac{R_w(H_{LV} + Q)}{E_{light}} \times 100$$

$$\eta_{STC} = \frac{\alpha C_{opt} q_i - \left[\varepsilon\sigma\left(T_2^4 - T_1^4\right) + h(T_2 - T_1)\right]}{P_{light}} \times 100$$

Where, α is optical absorption coefficient, Copt is optical concentration, ε is optical emission, σ is Stefan-Boltzmann constant, qi is Solar flux, h is convective heat transfer coefficient. $T_1$ is ambient temperature (K) and $T_2$ is the surface temperature (K) after illumination at t=2 h, $P_{light}$ is the solar power irradiated per square meter (W $m^{-2}$), $E_{light}$ is the energy input of the incident radiation (kJ $m^{-2}$ $h^{-1}$), HLV is the latent heat required for vaporization of water (J $kg^{-1}$); Q is the heat for increasing water temperature (J $kg^{-1}$).

We have taken all the three parameters (Rw, ηSTC, ηSVC) to evaluate the performance of NCF since these relate to the water evaporation rate, efficiencies of STC leading to solar-vapor generation. Thus, while ηSTC pertains to the generalized STC efficiency of the material and caters to wide-ranging applications, Rw and ηSVC are specific to solar-water evaporation.

Figure 9:
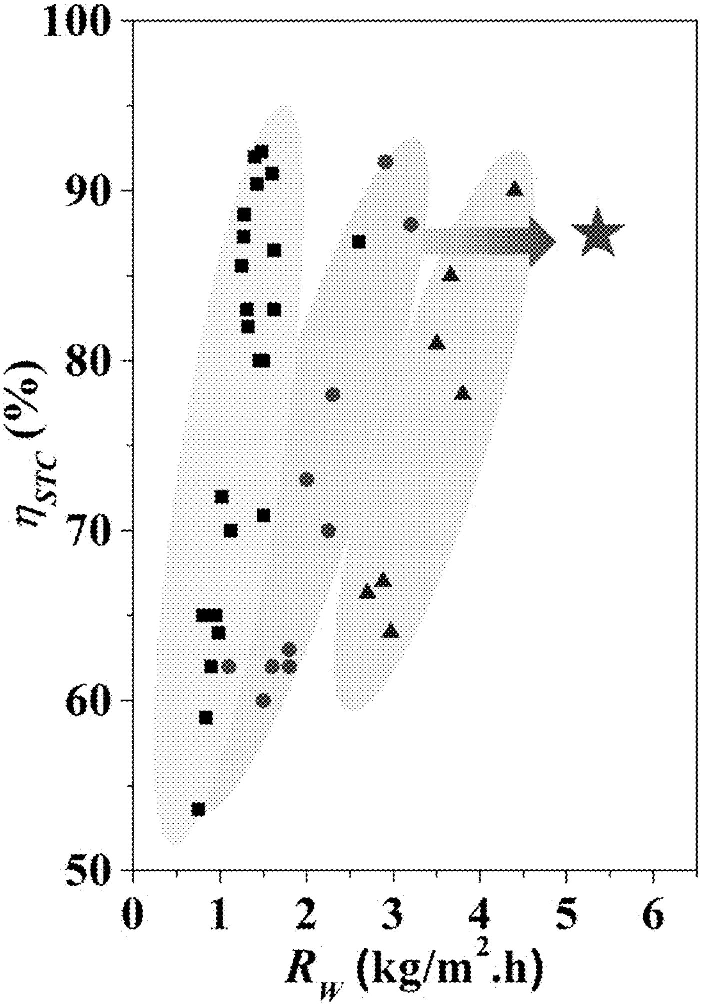
FIG. 9: Ashby plot comparing the performance of NCF with respect to other reports.[1-17]

Such a comprehensive comparison establishes the stand-out performance of NCF in terms of all these three parameters with ηSTC of 87%, ηSVC of 186% and Rw of 5.40 kg $m^{-2}$ $h^{-1}$. This is further illustrated through an Ashby plot (FIG. 9) that maps both ηSTC and ηSVC versus Rw. When considered synergistically the values of ηSVC, ηSTC and Rw are the highest reported as seen from the unique solitary position of NCF. This superlative performance under 1 sun and 2 sun exceeds that of several other materials under experimental conditions of 3 sun and beyond (FIG. 9). The significance of such superior performance is attributed to the confluence of the porosity, hard carbon structure, hydrophilicity, strong solar absorption and low thermal conductivity of NCF. These factors translate to a. morphology-driven efficient solar absorption, b. hard-carbon structure driven efficient photon thermalization, c. long-range disorder minimizing the conductive heat loss to enable greater heat localization, d. facile processability to achieve hydrophilic NCF coatings over arbitrary substrates such as filter paper and terracotta.

The synergistic interplay of all these parameters is validated from the invariance of ηSTC with solar irradiation over a large power range (ηSTC ~87% for 1 sun to 5 sun, FIG. 10*e*). Thus, the NCF coating exhibits uniformly high ηSTC under a wide range of solar illumination, thereby increasing its practical utility.

10) Versatile Demonstration of Solar-Thermal Conversion with NCF Coating: Space Heating 10.1) Experimental Setup A 11 turn tapered helical coil with half cone angle of 30° was made from copper tube (inner diameter 5 mm, outer diameter 6 mm) and its outer region was thermally insulated using glass wool. The inner region was spray-coated with NCF (loading 0.8 mg·$cm^{-2}$) and air was flown through the coil utilizing 120 W air pump at a rate of 10, 15 and 20 L/min. The entire setup was covered by glass (transmittance, $\tau_g$=0.98) and placed under Xe lamp and temperatures were recorded using thermocouples.

10.2) Description of Results and Applicability

We extend the versatility of NCF by realizing scalable, uniform coatings on hollow helical Cu tubes (inner diameter 5 mm) intended for active space-heating (FIG. 10*b,c*). The solar-heat generated by NCF coating conducts through the Cu walls (FIG. 10*b,c*) and heats up the air that flows inside the Cu channels. Thus, ΔTavg (outlet-inlet) ranging from 98-79.2 °C for flow rates between 10-20 L min−1, corresponding to residence times of 3 s and 1.5 s, respectively (FIG. 10*d*). Such rapid heating and high temperatures achieved auger direct translatability to on-field, real-time applications in arid locations that receive abundant solar irradiance but maintain low ground temperatures (example Ladakh, Leh in India). Importantly, such green space-heating exhibits distinct advantages over other risky and unhealthy solutions such as fuel-based heat generation.

11) Versatile Demonstration of NCF as Adsorbent for Heavy-Metal Scavenging from Water 11.1) Experimental Setup The heavy metal ions in feedstock and effluent are estimated using inductively coupled plasma atomic emission spectroscopy (ICP-AES). All heavy metal ions solutions are prepared with millipore water. Estimation of the uptake capacity of NCF for different heavy metal ions were conducted in a fix bed reactor geometry. 50 mg of NCF was packed in a vertical glass column of inner diameter 6 mm. Water containing known and pre-determined concentration of different heavy metal ions ranging from $Hg^{2+}$, $Cd^{2+}$, $As^{3+}$, $Cr^{6+}$ and $Cr^{3+}$ with concentration ranging from 50-200 ppm were passed through the NCF followed by collection of the effluent. Each such experiment was repeated for a minimum of five times to carry out a statistical analysis and thereby estimate standard deviation for the adsorption capacities. Aliquots of the eluents were retrieved at a time period of five minutes and subjected to ICP-AES to estimate the adsorption efficiencies. As in previous case, the standard deviation was estimated from a minimum of five such measurements. The adsorption capacities (qe, mg $g^{-1}$) is estimated from such ICP-AES measurements as $$q_e = \frac{\text{Weight of heavy metal ion adsorbed (in mg)}}{\text{Weight of } NCF \text{ (in g)}}$$

The weight of heavy metal ion adsorbed was estimated from batch-mode measurements using the initial and equilibrium heavy metal ion concentrations. The corresponding adsorption efficiency (AE, %) is estimated as $$AE = \frac{(C_i - C_f) * 100}{C_i}$$

Where $C_i$ and $C_f$ represents the initial and final concentration of the heavy metal ion (in ppm), as measured in the feedstock solution and filtrate solution, respectively (Table 3).

Calculation of AE for Various Heavy Metal Ions:—

| Heavy metal ion | Initial feedstock concentration (ppm) | Final filtrate concentration (ppm) | Adsorption efficiency (AE, %) |
|---|---|---|---|
| $Hg^{2+}$ | 200 | 14.6 | 92.7 |
| $Cd^{2+}$ | 200 | 28 | 86 |
| $As^{3+}$ | 200 | 14 | 93 |
| $Cr^{3+}$ | 200 | 16 | 92 |

The relative concentrations, monitored during the kinetic studies, was estimated as the ratio of concentration of heavy metal adsorbed by NCF at a given time to the feedstock concentration.

11.2) Description of Results and Applicability

Anthropogenically triggered escalating contamination of water by heavy metal ions ($As^{3+}$, $Cr^{6+}$, $Cd^{2+}$ and $Hg^{2+}$) demands newer and efficient types of adsorbents for their comprehensive scavenging. The wide pH range (pH 2-13) at which such contamination persists, makes it challenging to realize a single-step remediation approach. Addressing these escalating demands, a singular adsorbent capable of capturing multiple heavy metal ions with high adsorption capacity across a wide range of pH is herewith reported for sustainable water remediation. NCF with high specific surface area (936 $m^2$/g) and easily accessible open-ended pore structure (1.23 $cm^3$/g) achieves highly efficient removal of multiple heavy metal ions ($As^{3+}$, $Cr^{6+}$, $Cd^{2+}$ and $Hg^{2+}$). The hydrophilic surface of NCF ensures extensive and efficient interfacing with the water feedstock, while its chemical stability ensures its effectiveness as an adsorbent over a wide pH range (pH 3-pH 13). The synergistic combination of these factors enables excellent adsorption efficiency (AE ranging from 80% to 90%) and uniformly high adsorption capacity ($q_e$) towards a variety of heavy metal ions such as $Hg^{2+}$ (395±4 mg/g), $Cd^{2+}$ (402±5 mg/g), $Cr^{6+}$ (436±3 mg/g) and $As^{3+}$ (412±4 mg/g). Moreover, the gravity-driven purification of water does not demand any external source of electrical power and is scalable for on-site implementation. Facile regeneration of the NCF and its reusability over multiple cycles is also demonstrated for practical and sustainable application in water remediation.

Figure 11:
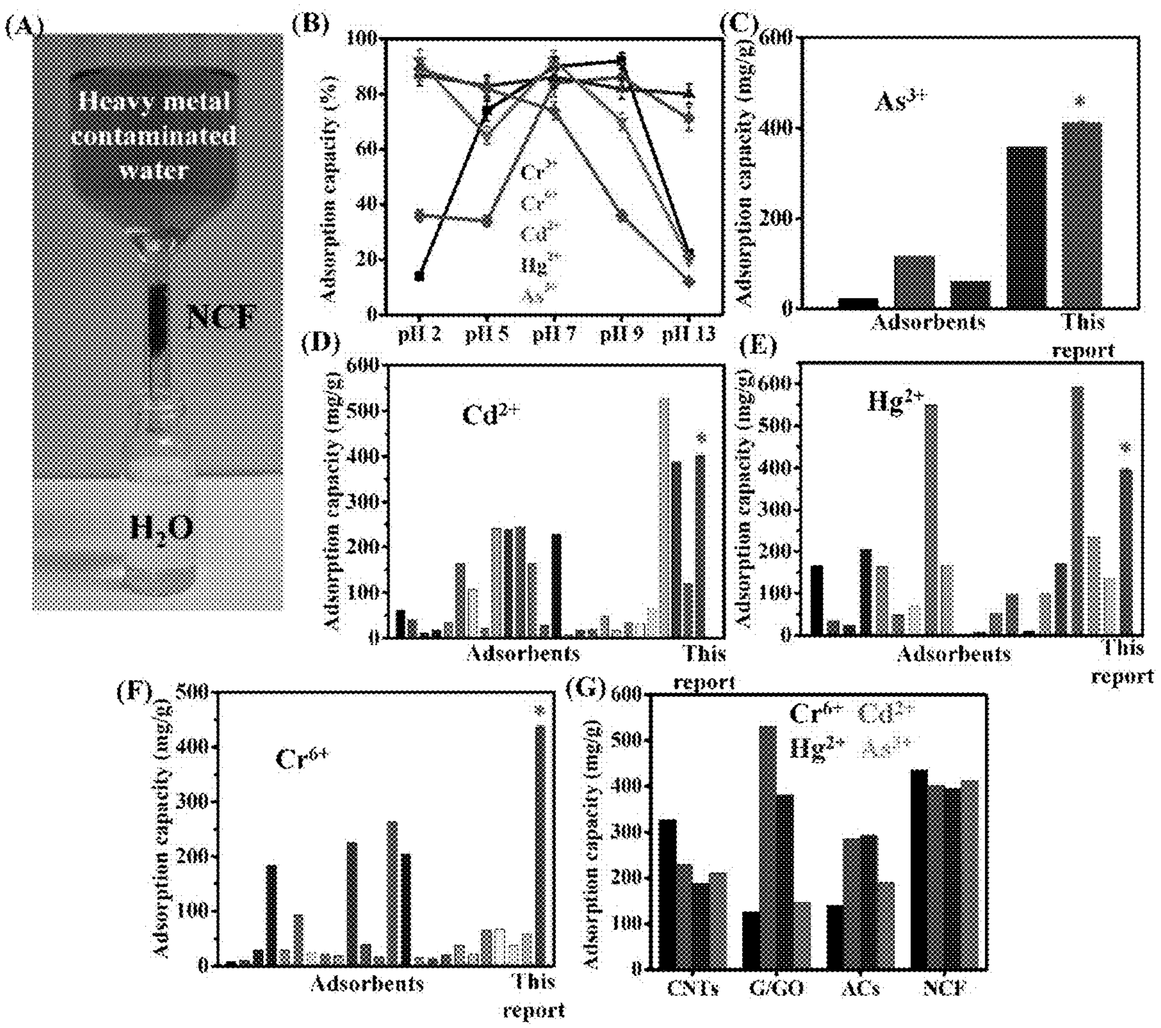
FIG. 11: A) The set up for adsorptive removal of heavy metal by NCF. B) Adsorption efficiency of various heavy metal ions as a function of pH. Comparative adsorption capacities of NCF (indicated with *) with various other adsorbents reported in literature for C) $As^{3+4,\ 7}$, D) $Cd^{2+1-7}$ E) $Hg^{2+1-7}$ F) $Cr^{6+2-4,\ 7}$ and G) Adsorption capacity of NCF as compared to other carbon-based material.[8-19]

Considering that real-time water remediation often involves treating effluents with varied pH, the adsorption capacity of NCF was evaluated with solutions of varying pH (pH 2-13) containing pre-determined concentration of various heavy metal ions ($As^{3+}$, $Cr^{3+}$, $Cd^{2+}$, $Hg^{2+}$, $Cr^{6+}$). From these investigations (FIG. 11), it is established that NCF shows greater selectivity towards $Cr^{3+}$ and $As^{3+}$ when compared to $Hg^{2+}$ and $Cd^{2+}$. In spite of this, the adsorption capacity of NCF towards all the four metal ions tested are comparable (FIG. 11). In fact, the adsorption capacities are higher than several reports in literature employing adsorbents such as biomass, carbon nanotube and graphene and comparable to other adsorbents such as MOFs, chitosan and dendritic polymers (FIG. 11). Further, adsorbents such as carbon nanotube and graphene in-spite of possessing higher specific surface area than NCF are found to exhibit significantly lower adsorption capacities (FIG. 11). Achieving these attributes in a single adsorbent has been particularly challenging from a technological viewpoint due to the requirement of specific and separate adsorbents.

REFERENCES

References for FIG. 9

1. P. Zhang, J. Li, L. Lv, Y. Zhao, L. Qu, *ACS Nano* 2017, 11, 5087.
2. V. Kashyap, H. Ghasemi, *J. Mater. Chem. A* 2020, 8, 7035.
3. V.-D. Dao, H.-S. Choi, *Glob. Challenges* 2018, 2, 1700094.
4. H.-S. Guan, T.-T. Fan, H.-Y. Bai, Y. Su, Z. Liu, X. Ning, M. Yu, S. Ramakrishna, Y.-Z. Long, *Carbon N. Y* 2022, 188, 265.
5. L. Zhou, Y. Tan, J. Zhu, *Light, Energy and the Environment* 2015, Opt. InfoBase Conf Pap. Suzhou, China, November, 2015.
6. G. Wang, Y. Fu, A. Guo, T. Mei, J. Wang, J. Li, X. Wang, *Chem. Mater.* 2017, 29, 5629.
7. F. Tao, Y. Zhang, K. Yin, S. Cao, X. Chang, Y. Lei, D. S. Wang, R. Fan, L. Dong, Y. Yin, X. Chen, *ACS Appl. Mater. Interfaces* 2018, 10, 35154.
8. Y. Fu, G. Wang, T. Mei, J. Li, J. Wang, X. Wang, *ACS Sustain. Chem. Eng.* 2017, 5, 4665.
9. Y. Zeng, K. Wang, J. Yao, H. Wang, *Chem. Eng. Sci.* 2014, 116, 704.
10. X. Lin, J. Chen, Z. Yuan, M. Yang, G. Chen, D. Yu, M. Zhang, W. Hong, X. Chen, *J. Mater. Chem. A* 2018, 6, 4642.
11. G. Wang, Y. Fu, X. Ma, W. Pi, D. Liu, X. Wang, *Carbon N. Y.* 2017, 114, 117.
12. L. Sun, J. Liu, Y. Zhao, J. Xu, Y. Li, *Carbon N. Y* 2019, 145, 352.
13. G. Zhu, J. Xu, W. Zhao, F. Huang, *ACS Appl. Mater. Interfaces* 2016, 8, 31716.
14. Y. Shi, R. Li, Y. Jin, S. Zhuo, L. Shi, J. Chang, S. Hong, K. C. Ng, P. Wang, *Joule* 2018, 2, 1171.
15. Y. Yang, R. Zhao, T. Zhang, K. Zhao, P. Xiao, Y. Ma, P. M. Ajayan, G. Shi, Y. Chen, *ACS Nano* 2018, 12, 829.
16. J. Yang, Y. Pang, W. Huang, S. K. Shaw, J. Schiffbauer, M. A. Pillers, X. Mu, S. Luo, T. Zhang, Y. Huang, G. Li, S. Ptasinska, M. Lieberman, T. Luo, *ACS Nano* 2017, 11, 5510.
17. G. Xue, K. Liu, Q. Chen, P. Yang, J. Li, T. Ding, J. Duan, B. Qi, J. Zhou, *ACS Appl. Mater. Interfaces* 2017, 9, 15052.

References for FIG. 11

1. Xu, J.; Cao, Z.; Zhang, Y.; Yuan, Z.; Lou, Z.; Xu, X.; Wang, X. *Chemosphere* 2018, 195, 351-364

2. Ihsanullah; Abbas, A.; Al-Amer, A. M.; Laoui, T.; Al-Marri, M. J.; Nasser, M. S.; Khraisheh, M.; Atieh, M. A. *Sep. Purif Technol.* 2016, 157, 141-161
3. Yu, G.; Lu, Y.; Guo, J.; Patel, M.; Bafana, A.; Wang, X.; Qiu, B.; Jeffryes, C.; Wei, S.; Guo, Z.; Wujcik, E. K. *Adv. Compos. Hybrid Mater.* 2018, 1, 56-78.
4. Wen, J.; Fang, Y.; Zeng, G. *Chemosphere* 2018, 201, 627-643.
5. Peng, Y.; Huang, H.; Zhang, Y.; Kang, C.; Chen, S.; Song, L.; Liu, D.; Zhong, C. *Nat. Commun.* 2018, 9, 187.
6. Mubarak, N. M.; Sahu, J. N.; Abdullah, E. C.; Jayakumar, N. S. *Sep. Purif Rev.* 2014, 43, 311-338.
7. Zhang, L.; Zeng, Y.; Cheng, Z. *J. Mol. Liq.* 2016, 214, 175-191.
8. Kadirvelu, K.; Thamaraiselvi, K.; Namasivayam, C. *Bioresour. Technol.* 2001, 76, 63-65.
9. Zhang, C.-Z.; Chen, B.; Bai, Y.; Xie, J. *Sep. Sci. Technol.* 2018, 53, 2896-2905.
10. Sitko, R.; Turek, E.; Zawisza, B.; Malicka, E.; Talik, E.; Heimann, J.; Gagor, A.; Feist, B.; Wrzalik, R. *Dalton Trans.* 2013, 42, 5682-5689.
11. AlOmar, M. K.; Alsaadi, M. A.; Hayyan, M.; Akib, S.; Ibrahim, M.; Hashim, M. A. *Chemosphere* 2017, 167, 44-52.
12. Kumar, S.; Nair, R. R.; Pillai, P. B.; Gupta, S. N.; Iyengar, M. A. R.; Sood, A. K. 2014, 6, 17426-17436.
13. Sankararamakrishnan, N.; Jaiswal, M.; Verma, N. *Chem. Eng. J.* 2014, 235, 1-9.
14. ShamsiJazeyi, H.; Kaghazchi, T. *Water Sci. Technol.* 2014, 69, 546-552.
15. Alijani, H.; Shariatinia, Z. *Chemosphere* 2017, 171, 502-511.
16. Moosa, A.; Ridha, A.; Najem Abdullha, I. *Int. J. Innov. Res. Sci. Eng. Technol.* 2015, 4, 275-282.
17. Awad, F. S.; AbouZeid, K. M.; El-Maaty, W. M. A.; El-Wakil, A. M.; El-Shall, M. S. *ACS Appl. Mater. Interfaces* 2017, 9, 34230-34242.
18. Hema, M.; Srinivasan, K. J. *Environ. Sci. Eng.* 2011, 53, 387-396.
19. Manju, G. N.; Raji, C.; Anirudhan, T. S. *Water Res.* 1998, 32, 3062-3070.

We claim:

1. A method for the preparation of porous hard-carbon nanostructure comprising the step of:

a) synthesizing porous hard-carbon nanostructure via chemical vapour deposition of a carbon source on a silica-based template such as dendritic fibrous nanosilica (DFNS), wherein the step of synthesizing comprises:
  i) keeping dendritic fibrous nanosilica (DFNS) in an alumina boat placed in the hottest zone of chemical vapour deposition (CVD) furnace and heated first to 120 °C in the furnace, under inert conditions to remove the adsorbed water for 15 minutes;
  ii) heating the DFNS from 120 °C to 700 °C to 800 °C at a ramp rate of 5 °C/min to 10 °C/min under a helium atmosphere having a flow rate of 700 SCCM; and
  iii) flowing a carbon source at 100 SCCM for 10 minutes as soon as the temperature reaches 740 °C followed by cooling the chemical vapour deposition (CVD) furnace till room temperature and collecting black powder of carbon coated silica nanospheres from the boat; and b) removing silica through alkali-mediated etching wherein the step of removing silica comprises:
  i) dispersing the carbon-coated silica nanospheres obtained in step (a) (iii) in an etching solution, placing the dispersion in a vacuum desiccator and evacuating the vacuum desiccator to a pressure of 10 torr for 10 minutes, followed by removing the dispersion from the vacuum desiccator and stirring the dispersion for 4 to 8 hours to etch out silica and obtain the porous hard-carbon nanostructure; and
  ii) washing the porous hard-carbon nanostructure with deionized water until the pH becomes neutral, followed by drying the porous hard-carbon nanostructure.

2. The method as claimed in claim 1, wherein the carbon source in step (a) (iii) is selected from the group consisting of acetylene, methane, carbon dioxide, carbon monoxide, ethanol, isopropanol, butane and isobutene.

3. The method as claimed in claim 1, wherein the etching solution is selected from the group consisting of 1 M sodium hydroxide (NaOH), 1 M potassium hydroxide (KOH), 1 M cesium hydroxide (CsOH), 2.5 M sodium hydroxide (NaOH), 2.5 M potassium hydroxide (KOH), 2.5 M cesium hydroxide (CSOH), buffered hydrogen fluoride (HF) and hydrogen fluoride (HF).

4. The method as claimed in claim 1, wherein the hard-carbon nanostructure are dried at 80 °C in an oven for 2 hours or in supercritical CO2 for 5 hours or in a lyophilizer for 5 hours.

5. The method as claimed in claim 1, further comprising preparing porous hard-carbon nanostructure dispersion for spray coating of hard-carbon nanostructure over a substrate.

6. The method as claimed in claim 5, wherein the porous hard-carbon nanostructure is dispersed in isopropanol via bath sonication for 2-10 minutes followed by spray coating of porous hard-carbon nanostructure using a spray coater over a substrate.

7. The method as claimed in claim 5, wherein the substrate is selected from the group consisting of filter paper, terracotta, tapered Copper (Cu) helical coil and tapered Aluminum (Al) coil.

8. The method as claimed in claim 1, wherein the dendritic fibrous nanosilica template of step (a) is prepared hydrolysis of at least one silica source in the presence of at least one surfactant, wherein the surfactant is selected from the group consisting of cetyl trimethyl ammonium bromide, hexanol, sodium dodecyl sulphate, sodium deoxycholate and derivatives thereof.

9. The method as claimed in claim 1, wherein the porous hard-carbon nanostructures are nanocarbon florets (NCF) having a surface area in the range of 850 m2/g to 1200 m2/g.

* * * * *